United States Patent
Pamarti et al.

(10) Patent No.: US 9,071,204 B2
(45) Date of Patent: Jun. 30, 2015

(54) DIGITAL POLAR AND ZVS CONTOUR BASED HYBRID POWER AMPLIFIER

(71) Applicant: THE REGENTS OF THE UNIVERSITY OF CALIFORNIA, Oakland, CA (US)

(72) Inventors: Sudhakar Pamarti, Los Angeles, CA (US); Nitesh Singhal, Los Angeles, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 61 days.

(21) Appl. No.: 14/069,120

(22) Filed: Oct. 31, 2013

(65) Prior Publication Data
US 2014/0125410 A1   May 8, 2014

Related U.S. Application Data

(60) Provisional application No. 61/720,918, filed on Oct. 31, 2012.

(51) Int. Cl.
| | |
|---|---|
| H03F 1/02 | (2006.01) |
| H03F 1/26 | (2006.01) |
| H03F 1/32 | (2006.01) |
| H03F 1/56 | (2006.01) |
| H03F 3/217 | (2006.01) |

(52) U.S. Cl.
CPC ............... *H03F 1/26* (2013.01); *H03F 1/0205* (2013.01); *H03F 1/3241* (2013.01); *H03F 1/565* (2013.01); *H03F 3/2176* (2013.01); *H03F 2200/378* (2013.01); *H03F 2200/387* (2013.01)

(58) Field of Classification Search
USPC ................. 330/149; 455/114.3; 375/296–297
See application file for complete search history.

(56) References Cited

U.S. PATENT DOCUMENTS 8,675,725 B2 * 3/2014 Staszewski et al. ........... 375/238

OTHER PUBLICATIONS

Singhal, et al. "A Power Amplifier with Minimal Efficiency Degradation under Back-Off," Circuits and Systems (ISCAS), Proceedings of 2010 IEEE International Symposium, May 30, 2010-Jun. 2, 2010, pp. 1-4.
Singhal, et al. "A 19 dBm 0.13 µm CMOS Parallel Class-E Switching PA with Minimal Efficiency Degradation under 6 dB Back-off," Radio Frequency Integrated Circuits Symposium (RFIC), 2011 IEEE, Jun. 5-7, 2011, pp. 1-4.
Singhal, et al. "A Zero-Voltage-Switching Contour-Based Power Amplifier With Minimal Efficiency Degradation Under Back-Off" IEEE Transactions on Microwave Theory and Techniques, vol. 59, No. 6, Jun. 2011, pp. 1-10.

* cited by examiner

*Primary Examiner* — Hieu Nguyen
(74) *Attorney, Agent, or Firm* — John P. O'Banion

(57) ABSTRACT

A power amplifier (PA) which improves dynamic range of previous ZVS contour-based power amplifier architectures is presented. The inventive circuit combines ZVS contour-based power amplification with a current mode digital-to-analog converter (DAC) based digital polar power amplifier. The inventive elements interoperate to provide high efficiency even at large peak power back-off levels and increased dynamic range. The invention is particularly well-suited for use in modulation schemes (e.g., WLAN/LTE/WIMAX) having large peak-to-average output power ratios. Utilizing the inventive PA in generating modulation in these systems can increase RF transmitter efficiency of by approximately two-fold.

20 Claims, 4 Drawing Sheets ced power levels. The
DIGITAL POLAR AND ZVS CONTOUR BASED HYBRID POWER AMPLIFIER

CROSS-REFERENCE TO RELATED APPLICATIONS

This application is a nonprovisional of U.S. provisional patent application Ser. No. 61/720,918 filed on Oct. 31, 2012, incorporated herein by reference in its entirety.

STATEMENT REGARDING FEDERALLY SPONSORED RESEARCH OR DEVELOPMENT

This invention was made with Government support of Grant No. 0725785, awarded by the National Science Foundation. The Government has certain rights in this invention.

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND OF THE INVENTION

1. Field of the Invention

This invention pertains generally to power amplifiers, and more particularly to a digital polar and ZVS contour-based hybrid power amplifier.

2. Description of Related Art

Linear power amplifiers (PAs) such as classes A, B, and AB are biased for peak output power and consequently suffer from poor efficiency at backed-off power levels. Techniques such as transformer-combiner based PA and envelope tracking have improved the efficiency of linear PAs. However, transformer-combiner based PAs are limited by die size constraints whereas envelope tracking suffers from supply regulator bandwidth and efficiency problems. The recent interest in digital PAs has produced numerous schemes, such as the digital envelope modulator and switching mixer PA. However, each of these new offerings while improving aspects, including PA linearity, similarly suffer from efficiency degradation.

Architectures based on switching PAs, such as supply modulation (e.g., polar and polar loop), theoretically offer high efficiency even at very low output power levels. However, they suffer from supply regulator inefficiency, which is particularly pronounced in response to handling wide bandwidth envelope variations. Duty cycle modulation and dynamic load modulation for class-E (switching) PAs, is directed at high peak efficiency, while it provides poor efficiency at low output powers. At low output power levels, the class-E PA operates sub-optimally as the so-called zero voltage switching (ZVS) conditions, which otherwise guarantee maximum efficiency circuit operation, are not satisfied resulting in significant losses and poor efficiency. The recent ZVS contour-based PAs achieve high efficiency under back-off; however, they have a dynamic range which is limited by the achievable duty cycle modulation.

Accordingly, a need exists for a new PA architecture which is readily implemented and capable of providing high efficiency even at significantly backed-off power levels. The present invention fulfills that need as well as others, while overcoming the shortcomings of previous PA approaches.

BRIEF SUMMARY OF THE INVENTION

The present invention improves the dynamic range of previously proposed ZVS contour-based power amplifier (PA) architectures, thus making it useful to be employed in modulation schemes including wireless local network (WLAN), long term evolution (e.g., 4G LTE) (LTE) and worldwide interoperability for microwave access (WIMAX), which have large peak-to-average output power ratios. The deployment of ZVS contour-based power amplifiers in generating such modulation schemes has the potential of increasing the efficiency of RF transmitters by a factor of two.

The invention benefits from interoperation between ZVS contour-based power amplification and a preferably current mode digital-to-analog converter (DAC) based digital polar power amplifier. The ZVS contour-based amplification is utilized to achieve high efficiency at higher powers, such as for up to about 10 dB back-off from peak power. Toward providing a higher dynamic range, the use of the current DAC based digital polar approach, despite its inherent losses, can readily extend dynamic range by approximately 36 dB. It should be appreciated that the use of the current DAC scheme results in poor operating efficiency below the 10 dB back-off. However, since the delivered output power is very small at such back-off levels, high average efficiency is achieved even for modulation schemes with large peak-to-minimum power ratio (PMR) signals, such as orthogonal frequency-division multiplexing (OFDM).

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

DETAILED DESCRIPTION OF THE INVENTION

Figure 1:
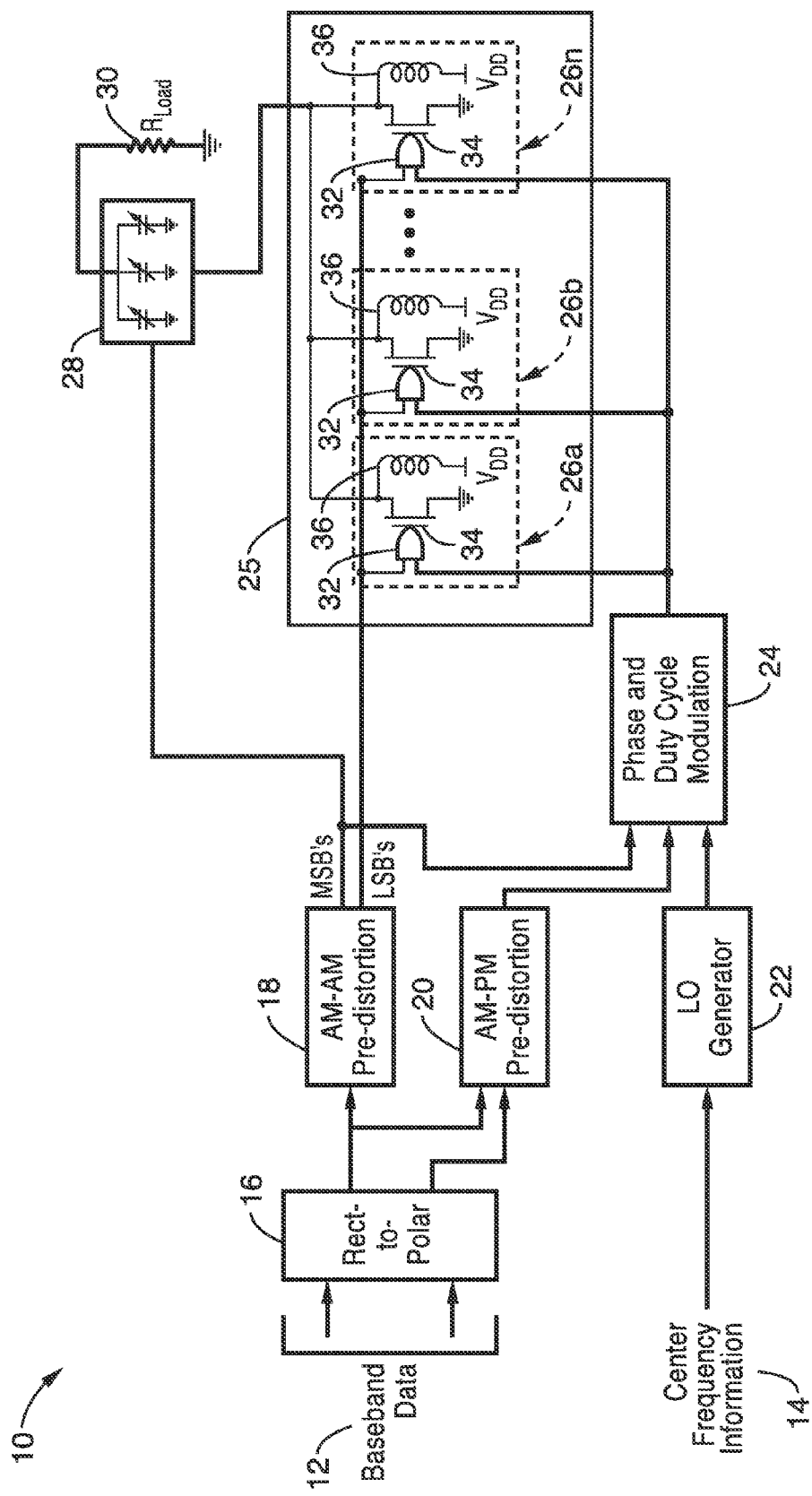
FIG. 1 is a block diagram of a digital polar and ZVS contour based hybrid power amplifier according to an embodiment of the invention.

FIG. 1 illustrates an example embodiment 10 of a hybrid power amplifier utilizing digital polar and ZVS contour modulation for driving a load 30 at high efficiency at desired power levels. It will be noted that ZVS contour modulation has limited dynamic range (10 dB for a parallel class-E version), while up to 46 dB dynamic range may be required even with oversampling envelope switching. To achieve the desired linearity, the inventive ZVS contour modulation power amplifier (PA) is combined with digital envelope modulation (also known as digital polar PA). It should be appreciated then, that beyond the range of the ZVS contour modulation, or in addition thereto, the main PA switch is broken up into smaller switches that are individually controlled depending on the desired instantaneous envelope level. This could result in poor efficiency below the 10 dB back-off; however, since the envelope PDF is typically small at such low power levels, high average efficiency will be achieved even for modulation schemes with large PMR signals such as OFDM.

In the figure, baseband data 12 (desired modulation data) is seen converted by a rectangular-to-polar converter 16, which converts the modulation from rectangular modulation (in-phase and quadrature components) to polar (amplitude and phase) form. It will be appreciated that if the original signal is in polar form already, that converter 16 would not be utilized.

Calibrated pre-distortion functions 18, 20 are performed on the polar output to compensate for systematic and random errors in the power amplifier. The pre-distortion functions preferably comprise an amplitude modulation (AM) to amplitude modulation (AM) circuit (AM-AM) 18, and an amplitude modulation (AM) to phase modulation (PM) circuit (AM-PM) 20, which each output digital bit streams.

A phase and duty cycle modulation circuit 24 modulates the phase and duty cycle of a periodic carrier signal generated by a local oscillator (LO Generator) 22 which receives center frequency information 14. It will be appreciated that the baseband data 12 and center frequency 14 are typically provided by a baseband controller or other control circuitry outputting the signals for amplification. Phase and duty cycle modulation block 24 receives digital streams from blocks 18 and 20, and the periodic carrier and modifies the duty cycle and phase of the carrier signal according to the most significant bits (MSBs) of the amplitude data stream.

The phase and duty cycle modulated output of block 24 drives a switching (class-E) power amplifier (PA) 25. It will be appreciated that class-E amplifiers utilize high speed switching of current through an LC network, followed by filtering. The PA of embodiment 10 is a switching parallel class-E amplifier implemented as a parallel combination of sections 26a, 26b through 26n, to allow changing amplifier power levels by changing the number of active amplifier sections, and preferably configured as a current mode digital-to-analog converter (DAC). Each parallel segment of this power amplifier is shown having logic 32 (e.g., a gate) for switching the transistor 34 on and off based on digital control signals. An inductor 36 is shown coupled to each transistor 34, (e.g., dividing up the inductor normally used in the LC portion of a class-E amplifier), although in other embodiments the sections would share one inductor.

PA 25 comprising parallel amplifier sections 26a-26n, can represent just the main switching elements in a class-E PA, or they can alternatively represent the branches of a class-E digital polar PA. These stages can be individually turned ON or OFF thereby delivering more or less power and are controlled by the least significant bits (LSBs) of the amplitude data stream.

A tunable impedance matching network 28 is shown having a transformation ratio determined by the most significant bits (MSBs) of the pre-distorted amplitude data stream from block 18. It should be appreciated that tunable impedance matching network 28 block shown also includes variable drain capacitance (e.g., C(D)), and often assorted passives, such as DC blocking capacitors and the like, and may contain additional inductors, transformers and so forth without departing from the teachings of the present invention.

It should be appreciated that the same MSBs of the amplitude data stream govern both the duty cycle of the class-E PA and the impedance matching network, which in combination implement a ZVS switching PA in which the drain capacitance is varied simultaneously.

As described above, the MSBs of the amplitude data stream control the class-E PA according to the ZVS contour control principles whereas the LSBs of the amplitude data stream control the class-E PA like a digital polar PA. The ZVS control ensures high efficiency operation for the power back-off range determined by the MSBs. The digital polar PA operation ensures that very low output powers can be delivered by the proposed PA and is not limited by achieved duty cycle modulation, or load modulation, or a combination of duty cycle and load modulation. Furthermore, digital polar PA operation also improves the resolution of power delivery even when the ZVS control is being employed.

It should be appreciated that the present invention describes a very specific combination of ZVS contour modulation and digital polar PA, which provides benefits beyond simple combinations, for instance combinations using digital polar PA for higher output range and ZVS control for a low output range, or alternatively combining them in parallel to achieve higher levels of back-off. The specific combination taught by the invention improves both efficiency and resolution based on interoperability between these elements. Furthermore, any such simple combinations as exemplified above result in severe AM-AM, and potentially AM-PM, distortion particularly for back-off power levels for which the control transitions from one approach to another significantly. The proposed AM-AM and AM-PM pre-distortion modules in the present invention, however, provide linearity that may be required for systems requiring large peak-to-average output power ratios, such as in WLAN, LTE, or WIMAX based systems.

Figure 3:
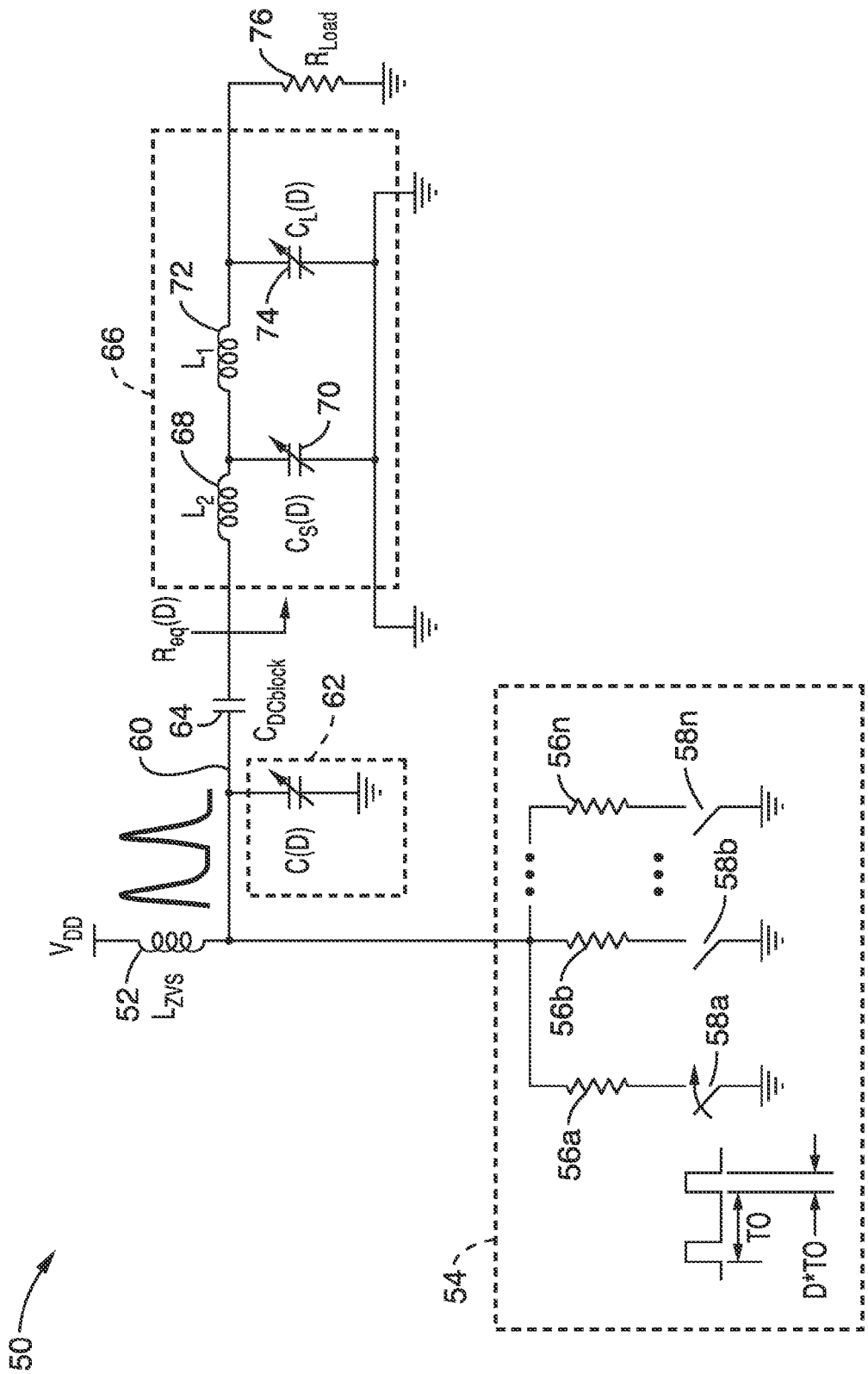
FIG. 3 is a schematic of a digital envelope modulation based ZVS contour PA utilized according to an embodiment of the present invention.

By way of example and not limitation the inventive hybrid PA seen in FIG. 1 can operate as follows. To achieve back-off from a peak output power level, the duty cycle D is reduced, such as from a first level (e.g., 50%) to a minimum level $D_{min}$, with some resolution, delta D. For this range of duty cycle values, the PA is operated in ZVS mode, such that C(D) and Req(D) seen in FIG. 3 are set according to ZVS equations and D. This approach achieves output power levels from $P_{max}$ to some $P_{zvs\_min}$ with approximately some resolution, delta_$P_{zvs}$. For power levels less than $P_{zvs\_min}$, duty cycle is set to $D_{min}$, and the DAC formed by the separate amplifier elements (e.g., sections 26a, 26b through 26n of FIG. 1) is operated by switching these sections of the power amplifier. It should be appreciated therefore, that one or more preferable embodiments of the invention are configured with weighted amplification power for each of these amplifier sections 26a, 26b through 26n of FIG. 1. In other words, P can be reduced with some resolution delta_$P_{dac}$.

It should be appreciated that delta_$P_{dac}$ will typically be smaller than delta_$P_{zvs}$. If that is the case, even in the ZVS mode, some of the smaller parts of the main PA switch could be turned OFF to get better than delta_$P_{zvs}$ resolution and possibly up to delta_$P_{dac}$ resolution. Although this is not necessary, it can be a useful option.

Figure 2B:
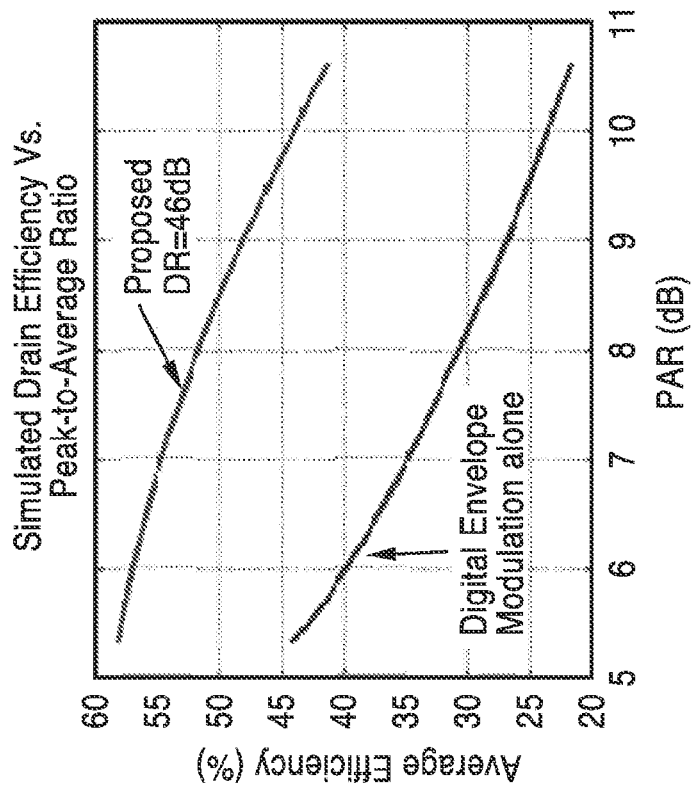
FIG. 2A and FIG. 2B are graphs of efficiency for the inventive hybrid power amplifier of FIG. 1.
Figure 2A:
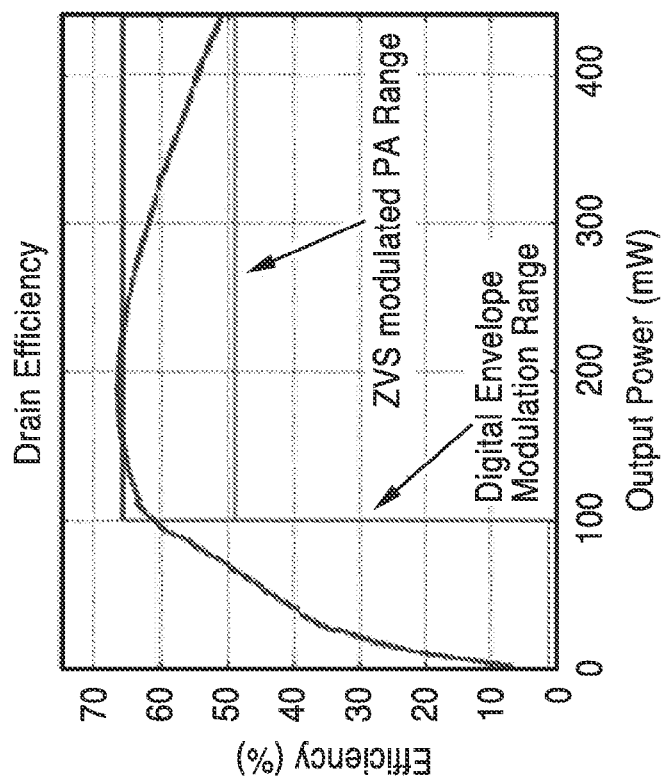

FIG. 2A and FIG. 2B depict efficiency curves for the inventive hybrid power amplifier. FIG. 2A shows simulation results of drain efficiency as a function of output power, showing the range of digital envelope modulation from 0 to 100 mW, and ZVS modulated PA range extending from 100 mW to over 400 mW of PA power for a specific embodiment.

FIG. 2B shows simulated average drain efficiency under example OFDM modulation signals of varying peak to average power ratio (PAR) values, for digital envelope modulation alone as shown in the lower portion of the graph, and for the inventive hybrid power amplifier with a dynamic range (DR) of 46 dB. The graph illustrates that the average efficiency for digital envelope modulation alone varies from about 45% at a peak-to-average ratio (PAR) nearing 5, down to just above 20% as PAR is between 10 and 11. By contrast to the above, the inventive circuit is seen providing nearly 60% average efficiency with (PAR) nearing 5, and drops down to just above 40% as PAR is between 10 and 11. At a PAR of 8, seen in the center of the graph, use of digital envelope modulation alone provided about 30% efficiency, while the inventive amplifier provided over 50% efficiency. Thus, the simulation indicates that the inventive apparatus improves average efficiency by about 20% over existing digital envelope modulation.

In one preferred implementation, the inventive PA is fabricated as one or more integrated circuits. For example, implementation could be in the form of a single integrated circuit of GaAs, SiGe, GaN, CMOS, or a combination of two or more integrated circuits of possibly different technologies, as the inventive teachings are independent of the type of technology being used. The present invention lends itself well to scaling and thus can lead to excellent linearity and efficiency when used in sub-micron technologies.

FIG. 3 is a schematic of digital envelope modulation based ZVS contour PA as utilized according to an embodiment of the present invention 50. A parallel class-E PA is shown with inductor $L_{ZVS}$ 52 between $V_{DD}$, and a digital polar PA section 54, along with a drain capacitor 62. It will be appreciated that the inductor may alternatively be separated into separate sections associated with each amplifier section as was seen in FIG. 1. It will be noted that in the present invention, the drain capacitor is variable to change ZVS conditions. Signal 60 is passed through capacitor $C_{DCblock}$ 64. It should be appreciated that an inductor and capacitor are standard components for a ZVS PA. After passing through the blocking capacitor, the signal is received by a tunable impedance transformation network 66 driving load 76.

Digital polar PA section 54 is shown exemplified with a combination of resistors 56a, 56b through 56n and associated (series) switches 58a, 58b through 58n (e.g., each switch is typically implemented with a transistor or other electronic switching means). In their simplest form, each branch represents a transistor in a switching PA modeled as an ideal switch in series with an ON resistance. More generally, each branch represents one part of a switching PA that could be turned ON or OFF independently of the other branches in forming a current mode digital-to-analog converter (DAC). For a purely ZVS PA, all the parts of the switching element would be controlled together, or a portion of them are turned OFF at low duty cycles values to improve power added efficiency. For the proposed digital polar PA plus ZVS contour combination, an appropriate number of branches are turned ON (the rest are OFF) depending on some desired amplitude data stream bits (e.g., LSBs typically). All the transistors that would be ON are driven by the same duty cycle and phase modulated carrier waveform. The figure only shows duty cycle modulation for the sake of simplicity as it only focuses on power back-off. It will be appreciated that duty cycle modulation and dynamic load modulation are performed in combination to preserve ZVS conditions.

In the present implementation, the ZVS contour is preferably utilized for the first 9 dB range, with subsequent back-off realized by switching sections of the power amplifier off. In particular, the figure describes the ZVS control principle applied to a parallel class-E PA (alternatively known as a finite drain inductance class-E PA), and the hardware that allows combining it with a digital polar PA.

It will be appreciated that traditional class-E PAs are designed such that so-called zero voltage switching (ZVS) conditions are satisfied when driven by a 50% duty cycle carrier waveform, toward guaranteeing high efficiency but only at one (i.e., peak) output power level. The ZVS contour principle allows the PA to be driven by a carrier signal (period is "T0") with non-50% duty cycle, D, and achieves high efficiency at the resulting (backed-off) power level by varying the drain capacitance C(D) 62 according to the duty cycle D, and using a tunable impedance transformation network 66 to present a variable impedance according to the duty cycle D. This process ensures that the class-E PA operates, for all achievable duty cycle values D on the ZVS contour.

One of ordinary skill in the art will appreciate that the tunable impedance transformation network may be implemented in a wide variety of circuit structures, utilizing passive or a combination of passive and active devices. For the sake of simplicity of illustration, this tunable matching network 66 is exemplified comprising stages having series inductors and tunable parallel capacitors, or their equivalents. The embodiment shown exemplifies this transformation network as comprising two LC stages, having series inductors 68, 72, and parallel variable capacitors 70, 74. The network transforms a given load, such as 50 Ohms, to a variable impedance, Zeq (D), where D is the instantaneous duty cycle of the carrier signal that drives the switching class-E PA. The following aspects of operation should be noted. First, when applied to a parallel class-E PA, the ZVS control principle is met when a variable resistance, Zeq(D)=Req(D), is presented to the switching PA, for the PA to operate on the ZVS contour (i.e., for the PA to satisfy ZVS conditions). For a series class-E PA, Zeq(D) needs to be the series combination of a fixed resistance and a variable inductance. Second, many impedance transformation networks can be implemented (e.g., various configurations and number of capacitors and inductors) to realize the desired impedance transformation, with the example in FIG. 3 showing but one reasonable implementation.

Following are a few principle equations which govern ZVS conditions for an arbitrary duty cycle in a series class-E PA. It should be appreciated, however, that ZVS is well known in the art, not just for series class-E PAs but other class-E topologies which may also be utilized in the present invention, such as parallel class-E PAs that employ a finite drain inductance, whereby a detailed discussion is not required.

Figure 4:
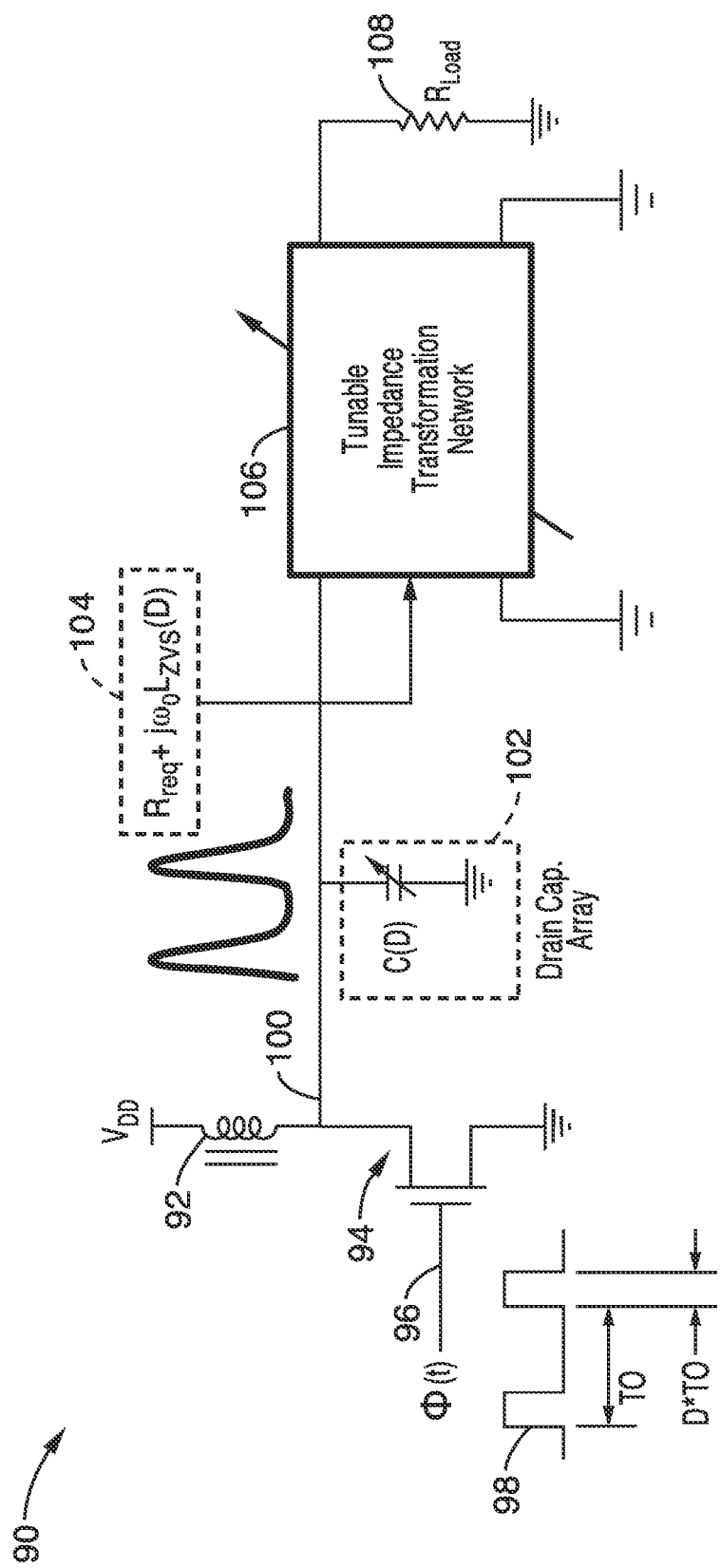
FIG. 4 is a schematic of a ZVS contour PA utilizing a series Class-E PA.

FIG. 4 depicts a series class-E PA 90, without the digital envelope modulation shown in FIG. 1 or FIG. 3. The schematic facilitates the following discussion of principles governing ZVS conditions. It should be appreciated, however, that the series class-E PA of FIG. 4 can be utilized according to the present invention, such as within FIG. 1 in place of the parallel Class-E PA. In FIG. 4 are shown an inductor 92 between $V_{DD}$ and a switch 94 with gate 96 configured for receiving a signal Φ(t) 98 with a given duty cycle D. A signal 100 is generated in response to the switching. A variable drain capacitor array 102 is shown connected in parallel with the switching device 94 (i.e., from inductor 92 to ground).

Switched signal 100 is received by a tunable impedance transformation network 106 which receives a control signal $R_{eq} + j\omega_0 L_{ZVS}(D)$ 104 and drives $R_{Load}$ 108.

For a series class-E PA, ZVS conditions are satisfied if the drain capacitance, C(D), 102, and the effective impedance presented to the PA given by:

$$Z_{eq}(D) = R_{eq} + j\omega_0 L_{ZVS}(D), \text{ are:}$$

$$\frac{\omega_0 L_{ZVS}(D)}{R_{req}} = g_1(D) \text{ and } C(D)\omega_0 R_{req} = g_2(D),$$

where $$g_1(D) = \frac{2\sin^2(\pi D)\cos^2\varphi + \frac{\pi}{2}(1-D)\cos(2\varphi)\sin(2\pi D) - \pi^2(1-D)^2}{2\sin\varphi\cos\varphi\sin(\pi D)(\pi(1-D)\cos(\pi D) + \sin(\pi D))}$$

$$\text{and } g_2(D) = \frac{(-\sin(2\varphi)\sin(\pi D))(\pi(1-D)\cos(\pi D) + \sin(\pi D))}{\pi^2(1-D)}$$

and where $$\varphi = -\tan^{-1}\left(\frac{1 + \pi(1-D)\cot(\pi D)}{\pi(1-D)}\right).$$

The parameter $R_{req}$ is chosen to deliver a desired peak output power $P_{max}$, from a given power supply voltage $V_{DD}$ according to the standard class-E PA design equations e.g., for a lossless PA case:

$$R_{req} = 0.577 \frac{V_{DD}^2}{P_{max}}.$$

The duty cycle D is chosen to deliver a desired power level $P_{out}$ according to the following equation:

$$P_{out} = g_3(D) \frac{V_{DD}^2}{R_{req}},$$

where $$g_3(D) = \frac{2\cos^2\varphi\sin^2(\pi D)}{\pi^2(1-D)^2}.$$

It will be appreciated that the present invention can be implemented in a number of variations without departing from the inventive teachings. The following are provided by way of example regarding some of those alternatives. (a) The input data exemplified in FIG. 1 is depicted in a Cartesian (rectangular) form; however, this input can be received in a polar form, whereby the rectangular-to-polar converter 16 of FIG. 1 would be unnecessary. (b) In certain applications, pre-distortion circuits, per se, may not be required if the application is not particular about distortion, although this is not typical. Alternatively, pre-distortion can be performed on the in-phase and quadrature signals, such as before a rectangular-to-polar conversion. (c) The phase modulation circuit 24 of FIG. 1 may be eliminated for certain embodiments. In that case, the input would be a phase modulated carrier and the result would be only a duty modulation circuit operating on it according to the desired duty cycle. (d) It should be noted that in the ZVS mode, the LSBs of the output of the AM-AM output block 18 can be eliminated for certain embodiments. While this is not desirable from a linearity point of view, it can facilitate circuit simplifications useful for select applications. (e) It can be generally desirable to have some overlap between ZVS mode and the digital polar mode, which are utilized in combination herein. For example, to get to power level=$P_{zvs\_min}$, one may use (i) $D=D_{min}$ or (ii) use $D>D_{min}$ and turn some PA switch portions OFF. Such "overlap" between the achievable power levels of the two modes is expected to simplify linearization of the PA. (f) There is a plethora of circuit structures for performing tunable impedance matching which can be utilized with the present invention, these are not limited to the simplified LC circuits shown by way of example in FIG. 3. These circuits can utilize traditional passive circuits, active circuits, combination right-left hand elements (CRLHs) and any other circuits which provide the desired impedance transformation. (g) For ease of practical implementations, it may not be desirable to exactly realize a particular value of C(D) or Req(D), as usually, a tradeoff is made between the efficiency of the impedance transformation network and the range and precision of such tunable networks. Thus, it may not be desirable to limit circuit embodiments to obtain C(D) or Req(D) exactly; and instead it can be best for a given application to accept slight deviations from the ZVS contour conditions to optimize the combination of efficiency, range and precision. (h) The idea of combining ZVS contour and digital polar should not be confined to one particular implementation of a digital polar PA, such as the current DAC variety shown in the figures, as the principles are applicable to other varieties as well.

From the discussion above it will be appreciated that the invention can be embodied in various ways, including the following:

1. A power amplification apparatus, comprising: pre-distortion circuits configured for outputting an amplitude data stream and phase data stream in response to receiving a digital polar signal; said pre-distortion circuits are configured for being calibrated to compensate for systematic and random errors in the power amplifier apparatus; a phase and duty cycle modulation circuit coupled for receiving outputs from said pre-distortion circuits along with a periodic carrier signal, with said modulation circuit configured for modulating the phase and duty cycle to produce a modulated output; a digital polar power amplifier (PA) connected for driving a load in response to drawing current through an inductance to a variable drain capacitance; and a tunable impedance matching network having a transformation ratio determined by most significant bits (MSBs) generated from at least a portion of said pre-distortion circuits and including digital envelope modulation through which a load is driven; wherein capacitance of said variable drain capacitance and impedance of said tunable impedance matching network are set according to ZVS conditions and duty cycle when said power amplification apparatus is operating in a ZVS mode.

2. The apparatus of any of the previous embodiments, wherein said digital polar power amplifier (PA) comprises a series or parallel class-E amplifier.

3. The apparatus of any of the previous embodiments, wherein said digital polar power amplifier (PA) comprises a parallel class-E amplifier having multiple sections which can be switched on or off in response to receiving least significant bits (LSBs) of modulated output from said pre-distortion circuits to control output power level.

4. The apparatus of any of the previous embodiments, wherein said multiple sections of said digital polar power amplifier (PA) form a digital-to-analog converter (DAC).

5. The apparatus of any of the previous embodiments, wherein back-off is achieved from a peak output power level by reducing duty cycle of said digital polar amplifier (PA) from a first level, and with continued back-off said duty cycle is reduced down to a minimum level while still operating under ZVS mode; then as additional back-off is desired, the DAC associated with said multiple sections of said digital polar power amplifier (PA) is operated with individual sections of this digital polar power amplifier (PA) being turned on or off.

6. The apparatus of any of the previous embodiments, wherein said pre-distortion circuits comprise an amplitude modulation to amplitude modulation (AM-AM) pre-distortion circuit configured for outputting a group of most significant bits (MSBs) and a group of least significant bits (LSBs), and an amplitude modulation to phase modulation (AM-PM) pre-distortion circuit outputting a digital bit stream.

7. The apparatus of any of the previous embodiments, further comprising a local oscillator coupled for receiving center frequency information and configured for generating phase and duty cycle of a periodic carrier signal.

8. The apparatus of any of the previous embodiments, wherein said digital polar power amplifier (PA) is configured for being driven to preserve zero voltage switching (ZVS) contour conditions.

9. The apparatus of any of the previous embodiments, further comprising a rectangular-to-polar converter before said pre-distortion circuits, whereby if modulation is received as rectangular modulation having in-phase and quadrature components, then the rectangular to polar converter is configured to convert this to a digital polar output which has amplitude and phase form.

10. The apparatus of any of the previous embodiments, wherein said power amplifier apparatus is configured for integration within systems selected from the group of systems requiring large peak-to-average output power ratios consisting of systems utilizing WLAN, LTE, and WIMAX standards.

11. A power amplification apparatus, comprising: a rectangular-to-polar converter configured for receiving desired modulation data as baseband data and converting this modulation from rectangular modulation, having in-phase and quadrature components, to a digital polar output which has amplitude and phase form; pre-distortion circuits configured for receiving the digital polar output and calibrated to compensate for systematic and random errors in the power amplifier apparatus and outputting an amplitude data stream and phase data stream; a tunable impedance matching network having a transformation ratio determined by most significant bits (MSBs) generated from at least a portion of said pre-distortion circuits and including digital envelope modulation through which a load is driven; a phase and duty cycle modulation circuit coupled for receiving outputs from said pre-distortion circuits along with a periodic carrier signal, with said modulation circuit configured for modulating the phase and duty cycle to produce a modulated output; and a digital polar power amplifier (PA) connected for driving the load in response to drawing current through said tunable impedance matching network, said digital polar power amplifier comprising multiple parallel sections of switching power amplifier (PA) which draw current through an inductor to a variable drain capacitance and are individually turned on or off in response to receiving least significant bits (LSBs) of modulated output from said pre-distortion circuits to control output power level; wherein capacitance of said variable drain capacitance and impedance of said tunable impedance matching network are set according to ZVS conditions and duty cycle when said power amplification apparatus is operating in a ZVS mode.

12. The apparatus of any of the previous embodiments, wherein said MSBs of the amplitude data stream are configured for controlling duty cycle of said switching power amplifier and impedance of said tunable impedance following ZVS contour principles, while the LSBs of the amplitude data stream are configured for controlling stages of said switching power amplifier in a digital polar manner.

13. The apparatus of any of the previous embodiments, wherein said pre-distortion circuits comprise an amplitude modulation to amplitude modulation (AM-AM) pre-distortion circuit configured for outputting a group of most significant bits (MSBs) and a group of least significant bits (LSBs), and an amplitude modulation to phase modulation (AM-PM) pre-distortion circuit configured for outputting a digital bit stream.

14. The apparatus of any of the previous embodiments, further comprising a local oscillator configured for receiving center frequency information and generating phase and duty cycle of a periodic carrier signal.

15. The apparatus of any of the previous embodiments, wherein said digital polar power amplifier (PA) is configured for being driven to preserve zero voltage switching (ZVS) contour conditions when all sections of said digital polar power amplifier (PA) are active.

16. The apparatus of any of the previous embodiments, wherein said multiple sections of said digital polar power amplifier (PA) form a digital to analog converter (DAC).

17. The apparatus of any of the previous embodiments, wherein back-off is achieved from a peak output power level by reducing duty cycle of said digital polar amplifier (PA) from a first level, and with continued back-off said duty cycle is reduced down to a minimum level while still operating under ZVS mode; then as additional back-off is required, the DAC associated with said multiple sections of said digital polar power amplifier (PA) is utilized with individual sections of this digital polar power amplifier (PA) being turned on or off.

18. The apparatus of any of the previous embodiments, wherein said power amplifier apparatus is configured for integration within systems selected from the group of systems requiring large peak-to-average output power ratios consisting of systems utilizing WLAN, LTE, and WIMAX standards.

19. A digital polar and ZVS contour based hybrid power amplification apparatus, comprising: a rectangular-to-polar converter configured for receiving desired modulation data as baseband data and converting this modulation from rectangular modulation, having in-phase and quadrature components, to a digital polar output which has amplitude and phase form; pre-distortion circuits configured for receiving the digital polar output and calibrated to compensate for systematic and random errors in the power amplifier apparatus and outputting an amplitude data stream and phase data stream; wherein said pre-distortion circuits comprise an amplitude modulation to amplitude modulation (AM-AM) pre-distortion circuit configured for outputting a group of most significant bits (MSBs) and a group of least significant bits (LSBs), and an amplitude modulation to phase modulation (AM-PM) pre-distortion circuit outputting a digital bit stream; a local oscillator configured for receiving center frequency information and generating phase and duty cycle of a periodic carrier signal output; a tunable impedance matching network having a transformation ratio determined by most significant bits (MSBs) generated from at least a portion of said pre-distortion circuits and including digital envelope modulation through which a load is driven; a phase and duty cycle modulation circuit coupled for receiving outputs from said pre-distortion circuits along with said periodic carrier signal output from said local oscillator, with said phase and duty cycle modulation circuit configured for modulating the phase and duty cycle to generate a modulated output; and a digital polar power amplifier (PA) connected for driving the load in response to drawing current through said tunable impedance matching network, said digital polar power amplifier comprising multiple parallel sections of switching power amplifier (PA) which draw current through an inductor to a variable drain capacitance and are individually turned on or off in response to receiving least significant bits (LSBs) of modulated output from said pre-distortion circuits to control output power level; wherein said most significant bits (MSBs) are configured for controlling duty cycle of said switching power amplifier and impedance of said tunable impedance utilizing ZVS contour principles, while the LSBs of the amplitude data stream are configured for controlling stages of said switching power amplifier in a digital polar manner; and wherein capacitance of said variable drain capacitance and impedance of said tunable impedance matching network are configured for being set according to ZVS conditions and duty cycle when said power amplification apparatus is operating in a ZVS mode.

20. The apparatus of any of the previous embodiments, wherein said digital polar power amplifier (PA) is configured for being driven to preserve zero voltage switching (ZVS) contour conditions when all sections of said digital polar power amplifier (PA) are active.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A power amplification apparatus, comprising:
    pre-distortion circuits configured for outputting an amplitude data stream and phase data stream in response to receiving a digital polar signal;
    said pre-distortion circuits are configured for being calibrated to compensate for systematic and random errors in the power amplifier apparatus;
    a phase and duty cycle modulation circuit coupled for receiving outputs from said pre-distortion circuits along with a periodic carrier signal, with said modulation circuit configured for modulating the phase and duty cycle to produce a modulated output;
    a digital polar power amplifier (PA) connected for driving a load in response to drawing current through an inductance to a variable drain capacitance; and
    a tunable impedance matching network having a transformation ratio determined by most significant bits (MSBs) generated from at least a portion of said pre-distortion circuits and including digital envelope modulation through which a load is driven;
    wherein capacitance of said variable drain capacitance and impedance of said tunable impedance matching network are set according to ZVS conditions and duty cycle when said power amplification apparatus is operating in a ZVS mode.

2. The apparatus recited in claim 1, wherein said digital polar power amplifier (PA) comprises a series or parallel class-E amplifier.

3. The apparatus recited in claim 1, wherein said digital polar power amplifier (PA) comprises a parallel class-E amplifier having multiple sections which can be switched on or off in response to receiving least significant bits (LSBs) of modulated output from said pre-distortion circuits to control output power level.

4. The apparatus recited in claim 3, wherein said multiple sections of said digital polar power amplifier (PA) form a digital-to-analog converter (DAC).

5. The apparatus recited in claim 4, wherein back-off is achieved from a peak output power level by reducing duty cycle of said digital polar amplifier (PA) from a first level, and with continued back-off said duty cycle is reduced down to a minimum level while still operating under ZVS mode; then as additional back-off is desired, the DAC associated with said multiple sections of said digital polar power amplifier (PA) is operated with individual sections of this digital polar power amplifier (PA) being turned on or off.

6. The apparatus recited in claim 1, wherein said pre-distortion circuits comprise an amplitude modulation to amplitude modulation (AM-AM) pre-distortion circuit configured for outputting a group of most significant bits (MSBs) and a group of least significant bits (LSBs), and an amplitude modulation to phase modulation (AM-PM) pre-distortion circuit outputting a digital bit stream.

7. The apparatus recited in claim 1, further comprising a local oscillator coupled for receiving center frequency information and configured for generating phase and duty cycle of a periodic carrier signal.

8. The apparatus recited in claim 1, wherein said digital polar power amplifier (PA) is configured for being driven to preserve zero voltage switching (ZVS) contour conditions.

9. The apparatus recited in claim 1, further comprising a rectangular-to-polar converter before said pre-distortion circuits, whereby if modulation is received as rectangular modulation having in-phase and quadrature components, then the rectangular to polar converter is configured to convert this to a digital polar output which has amplitude and phase form.

10. The apparatus recited in claim 1, wherein said power amplifier apparatus is configured for integration within systems selected from the group of systems requiring large peak-to-average output power ratios consisting of systems utilizing WLAN, LTE, and WIMAX standards.

11. A power amplification apparatus, comprising:
    a rectangular-to-polar converter configured for receiving desired modulation data as baseband data and converting this modulation from rectangular modulation, having in-phase and quadrature components, to a digital polar output which has amplitude and phase form;
    pre-distortion circuits configured for receiving the digital polar output and calibrated to compensate for systematic and random errors in the power amplifier apparatus and outputting an amplitude data stream and phase data stream;

a tunable impedance matching network having a transformation ratio determined by most significant bits (MSBs) generated from at least a portion of said pre-distortion circuits and including digital envelope modulation through which a load is driven;

a phase and duty cycle modulation circuit coupled for receiving outputs from said pre-distortion circuits along with a periodic carrier signal, with said modulation circuit configured for modulating the phase and duty cycle to produce a modulated output; and a digital polar power amplifier (PA) connected for driving the load in response to drawing current through said tunable impedance matching network, said digital polar power amplifier comprising multiple parallel sections of switching power amplifier (PA) which draw current through an inductor to a variable drain capacitance and are individually turned on or off in response to receiving least significant bits (LSBs) of modulated output from said pre-distortion circuits to control output power level;

wherein capacitance of said variable drain capacitance and impedance of said tunable impedance matching network are set according to ZVS conditions and duty cycle when said power amplification apparatus is operating in a ZVS mode.

12. The apparatus recited in claim 11, wherein said MSBs of the amplitude data stream are configured for controlling duty cycle of said switching power amplifier and impedance of said tunable impedance following ZVS contour principles, while the LSBs of the amplitude data stream are configured for controlling stages of said switching power amplifier in a digital polar manner.

13. The apparatus recited in claim 11, wherein said pre-distortion circuits comprise an amplitude modulation to amplitude modulation (AM-AM) pre-distortion circuit configured for outputting a group of most significant bits (MSBs) and a group of least significant bits (LSBs), and an amplitude modulation to phase modulation (AM-PM) pre-distortion circuit configured for outputting a digital bit stream.

14. The apparatus recited in claim 11, further comprising a local oscillator configured for receiving center frequency information and generating phase and duty cycle of a periodic carrier signal.

15. The apparatus recited in claim 11, wherein said digital polar power amplifier (PA) is configured for being driven to preserve zero voltage switching (ZVS) contour conditions when all sections of said digital polar power amplifier (PA) are active.

16. The apparatus recited in claim 11, wherein said multiple sections of said digital polar power amplifier (PA) form a digital to analog converter (DAC).

17. The apparatus recited in claim 16, wherein back-off is achieved from a peak output power level by reducing duty cycle of said digital polar amplifier (PA) from a first level, and with continued back-off said duty cycle is reduced down to a minimum level while still operating under ZVS mode; then as additional back-off is required, the DAC associated with said multiple sections of said digital polar power amplifier (PA) is utilized with individual sections of this digital polar power amplifier (PA) being turned on or off.

18. The apparatus recited in claim 11, wherein said power amplifier apparatus is configured for integration within systems selected from the group of systems requiring large peak-to-average output power ratios consisting of systems utilizing WLAN, LTE, and WIMAX standards.

19. A digital polar and ZVS contour based hybrid power amplification apparatus, comprising:

a rectangular-to-polar converter configured for receiving desired modulation data as baseband data and converting this modulation from rectangular modulation, having in-phase and quadrature components, to a digital polar output which has amplitude and phase form;

pre-distortion circuits configured for receiving the digital polar output and calibrated to compensate for systematic and random errors in the power amplifier apparatus and outputting an amplitude data stream and phase data stream;

wherein said pre-distortion circuits comprise an amplitude modulation to amplitude modulation (AM-AM) pre-distortion circuit configured for outputting a group of most significant bits (MSBs) and a group of least significant bits (LSBs), and an amplitude modulation to phase modulation (AM-PM) pre-distortion circuit outputting a digital bit stream;

a local oscillator configured for receiving center frequency information and generating phase and duty cycle of a periodic carrier signal output;

a tunable impedance matching network having a transformation ratio determined by most significant bits (MSBs) generated from at least a portion of said pre-distortion circuits and including digital envelope modulation through which a load is driven;

a phase and duty cycle modulation circuit coupled for receiving outputs from said pre-distortion circuits along with said periodic carrier signal output from said local oscillator, with said phase and duty cycle modulation circuit configured for modulating the phase and duty cycle to generate a modulated output; and a digital polar power amplifier (PA) connected for driving the load in response to drawing current through said tunable impedance matching network, said digital polar power amplifier comprising multiple parallel sections of switching power amplifier (PA) which draw current through an inductor to a variable drain capacitance and are individually turned on or off in response to receiving least significant bits (LSBs) of modulated output from said pre-distortion circuits to control output power level;

wherein said most significant bits (MSBs) are configured for controlling duty cycle of said switching power amplifier and impedance of said tunable impedance utilizing ZVS contour principles, while the LSBs of the amplitude data stream are configured for controlling stages of said switching power amplifier in a digital polar manner; and wherein capacitance of said variable drain capacitance and impedance of said tunable impedance matching network are configured for being set according to ZVS conditions and duty cycle when said power amplification apparatus is operating in a ZVS mode.

20. The apparatus recited in claim 19, wherein said digital polar power amplifier (PA) is configured for being driven to preserve zero voltage switching (ZVS) contour conditions when all sections of said digital polar power amplifier (PA) are active.

* * * * *